(12) United States Patent
Sanderfer

(10) Patent No.: US 6,387,820 B1
(45) Date of Patent: May 14, 2002

(54) BC13/AR CHEMISTRY FOR METAL OVERETCHING ON A HIGH DENSITY PLASMA ETCHER

(75) Inventor: Anne Sanderfer, Campbell, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 59 days.

(21) Appl. No.: 09/664,950

(22) Filed: Sep. 19, 2000

(51) Int. Cl.[7] ............................................. H01L 21/461
(52) U.S. Cl. ..................... 438/725; 438/710; 438/627; 438/696; 438/740; 438/734; 438/952
(58) Field of Search ................................ 438/696, 700, 438/720, 717, 723, 742, 952, 627, 714, 721, 724, 734, 725, 740, 15, 16, 710

(56) References Cited

U.S. PATENT DOCUMENTS

| | | | | |
|---|---|---|---|---|
| 4,472,237 A | * | 9/1984 | Deslauriers et al. | 156/643 |
| 5,013,398 A | * | 5/1991 | Long et al. | 156/643 |
| 5,849,641 A | * | 12/1998 | Arnett et al. | 438/734 |
| 5,858,879 A | * | 1/1999 | Chao et al. | 438/725 |
| 5,958,801 A | * | 9/1999 | Langley | 438/738 |
| 6,103,630 A | * | 8/2000 | Lee et al. | 438/696 |
| 6,133,145 A | * | 10/2000 | Chen | 438/636 |
| 6,133,156 A | * | 10/2000 | Langley | 438/719 |
| 6,159,863 A | * | 12/2000 | Chen et al. | 438/720 |
| 6,268,287 B1 | * | 7/2001 | Young et al. | 438/671 |
| 6,291,356 B1 | * | 9/2001 | Ionov et al. | 438/710 |
| 6,291,361 B1 | * | 9/2001 | Hsia et al. | 437/738 |
| 6,303,510 B1 | * | 10/2001 | Chien et al. | 438/710 |

FOREIGN PATENT DOCUMENTS

| | | | | |
|---|---|---|---|---|
| EP | 0731501 A1 | * | 9/1996 | H01L/21/321 |
| EP | 1011135 A2 | * | 6/2000 | H01L/21/768 |

OTHER PUBLICATIONS

Sabouret et al. "Reactive Ion Etching of metal stack consisting of an aluminium alloy, WGex barrier and Ti adhesion layer", Materials for Advanced Metallization (MAM) 1997, pp. 138–139.*

* cited by examiner

Primary Examiner—Matthew Smith
Assistant Examiner—Renzo N. Rocchegiani
(74) Attorney, Agent, or Firm—H. Donald Nelson

(57) ABSTRACT

A method of manufacturing a semiconductor device by forming layers of materials on a semiconductor substrate and utilizing a series of etch chemistries to remove portions of the layers of materials to form a metal stack. A patterned layer of photoresist determines the portions of the layers that will be etched. An etch process etches a hardmask material, a breakthrough etch process etches an antireflection layer, a conventional main etch process etches approximately 80 percent of the metal film, a first overetch process for a first selected period of time and a second overetch process for a second selected period of time provides a metal film stack having straight profiles and smooth sidewalls.

6 Claims, 3 Drawing Sheets

BC13/AR CHEMISTRY FOR METAL OVERETCHING ON A HIGH DENSITY PLASMA ETCHER

BACKGROUND OF THE INVENTION

1. Field of the Invention

This invention relates generally to a method of manufacturing semiconductor devices. More specifically, this invention relates to a method of etching a metal stack. Even more specifically, this invention relates to a method of etching a metal stack having straight film stack profiles and smooth sidewalls.

2. Discussion of the Related Art

As the prices of semiconductor devices continue to plummet, more components and more complex components are incorporated into devices to extend their performance and functionally and thus to maintain their price and profitability. However, increased performance and functionality requires greater density and increased transistor counts, which in turn, requires more interconnections and increased layers to accommodate the increased number of interconnections. The interconnections connect electrodes of active devices typically formed in the active layer with other electrodes of other active devices in the active layer as well as connect active devices to terminals that communicate with external devices.

Because the number of active devices has increased dramatically and continues to increase, the number of interconnections has also increased dramatically and to accommodate the number of interconnections the number of metal layers has also has to be increased.

The increasing number of interconnections has required the interconnects to be closer together to the point that it is necessary to have smooth sidewalls to maintain desired electrical parameters between adjacent metal lines. It is necessary to have a high quality metal etch process. Some of the characteristics for a good metal etch process are as follows: straight film stack profiles, smooth sidewalls (not voidy) and a certain amount of oxide gouging to eliminate stringers and bridging. However, these results are challenging to achieve with the ever-shrinking resist film thickness. The push for smaller geometry (metal line/space/pitch) has required photolithography to decrease the photoresist thickness due to focus and exposure limitations. A problem in the metal stack etching process is the problem of achieving all the metal etch criteria without consuming all or substantially all of the layer of photoresist. Consumption of all or substantially all of the layer of photoresist prior to the completion of the etch process of the metal stack typically results in profile undercutting and voidy sidewalls of the metal stack resulting in critical dimension loss, yield loss and reliability issues.

Therefore, what is needed is a method of etching metal stacks that result in metal stacks that have straight film stack profiles, smooth sidewalls (not voidy) and a certain amount of oxide gouging to eliminate stringers and bridging.

SUMMARY OF THE INVENTION

According to the present invention, the foregoing and other objects and advantages are achieved by a method of manufacturing semiconductor devices including forming layers of materials that form a metal stack in semiconductor devices and the subsequent etching of the layers of materials utilizing etch chemistries that result in metal stacks having straight profiles and smooth sidewalls.

According to an aspect of the invention, a main etch process etches approximately 80% of the metal film, a first overetch process for a first selected period of time and a second overetch process for a second selected period of time result in the metal stacks having straight profiles and smooth sidewalls.

According to an aspect of the invention, the first overetch step includes $BCl_3$ at about 41 sccm, Ar at about 50 sccm, $Cl_2$ at about 34 sccm, $CHF_3$ at about 3 sccm, a pressure of about 12 mtorr, a source power of about 1000 watts and a bias power of about 130 watts applied for a first selected period of time, which has been determined during a pre-characterization procedure.

According to another aspect of the invention, the second overetch step includes $BCl_3$ at between 10–35 sccm, Ar between 0–50 sccm, $N_2$ between 0–8 sccm, $CHF_3$, between 0–8 sccm, a pressure between 10–18 mtorr, a source power of between 600–1400 watts and a bias power of between 100–2000 watts applied for a second selected period of time, which has been determined during a pre-characterization procedure.

According to another aspect of the invention, the main etch process to etch about 80% of the layer of metal film includes $BCl_3$ at about 17 sccm, Ar at about 50 sccm, $Cl_2$ at about 43 sccm, $CHF_3$ at about 3 sccm, a source power of about 1000 watts and a source power of about 150 watts.

According to another aspect of the invention, the etch process to etch through the antireflection layer comprises the chemistry $BCl_3$, $Cl_2$, Ar, and $CHF_3$.

According to another aspect of the invention, the etch process to etch through the hardmask layer comprises the chemistry $BCl_3$, Ar, and $CHF_3$.

The described method of manufacturing semiconductor devices thus provides metal stacks having straight profiles and smooth surfaces.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DETAILED DESCRIPTION

Reference is now made in detail to a specific embodiment or specific embodiments of the present invention that illustrate the best mode or modes presently contemplated by the inventors for practicing the invention.

Figure 1:
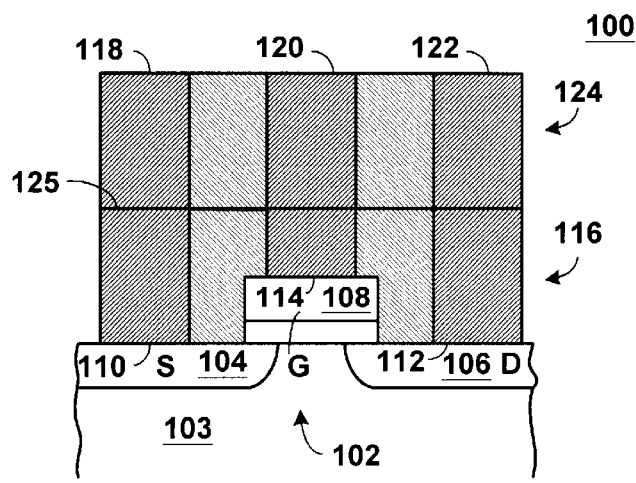
FIG. 1 shows a portion of a partially completed semiconductor device illustrating a typical portion of a semiconductor device in which the present invention is involved.

FIG. 1 shows a portion 100 of a partially completed semiconductor device illustrating a typical portion of a semiconductor device. The portion 100 shows an active device 102 that is made up of a source 104, a drain 106 and a gate 108. The active device 102 is formed in a substrate 103 that is lightly doped silicon. The source 104, the drain 106 and gate 108 are electrodes that need to electrically communicate to other devices either in the semiconductor device or to devices external to the semiconductor device. Structures 110, 112, and 114 are metal vias that form an electrical contact with the source 104, the drain 106 and the gate 108, respectively. A layer of oxide 116 that electrically insulates the metal structures 110, 112, and 114 surrounds the metal structures 110, 112, and 114. Metal structures 118, 120 and 122 can be either vias that connect the underlying metal structure to another layer or wires that connect the underlying metal structure to other parts of the layer. If the metal structure 118, 120, or 122 is a wire it has a horizontal dimension that extends either into the plane of the page or out of the plane of the page or both. A second layer of oxide 124 that electrically insulates the metal structures 118, 120 and 122 surrounds the metal structures 118, 120 and 122. The second layer of oxide 124 and the metal structures 118, 120 and 122 are planarized to form a flat surface 125 for subsequent processes. Typically, the planarization process is a chemical-mechanical-polish (CMP) process and is well known in the semiconductor manufacturing art.

Figure 2:
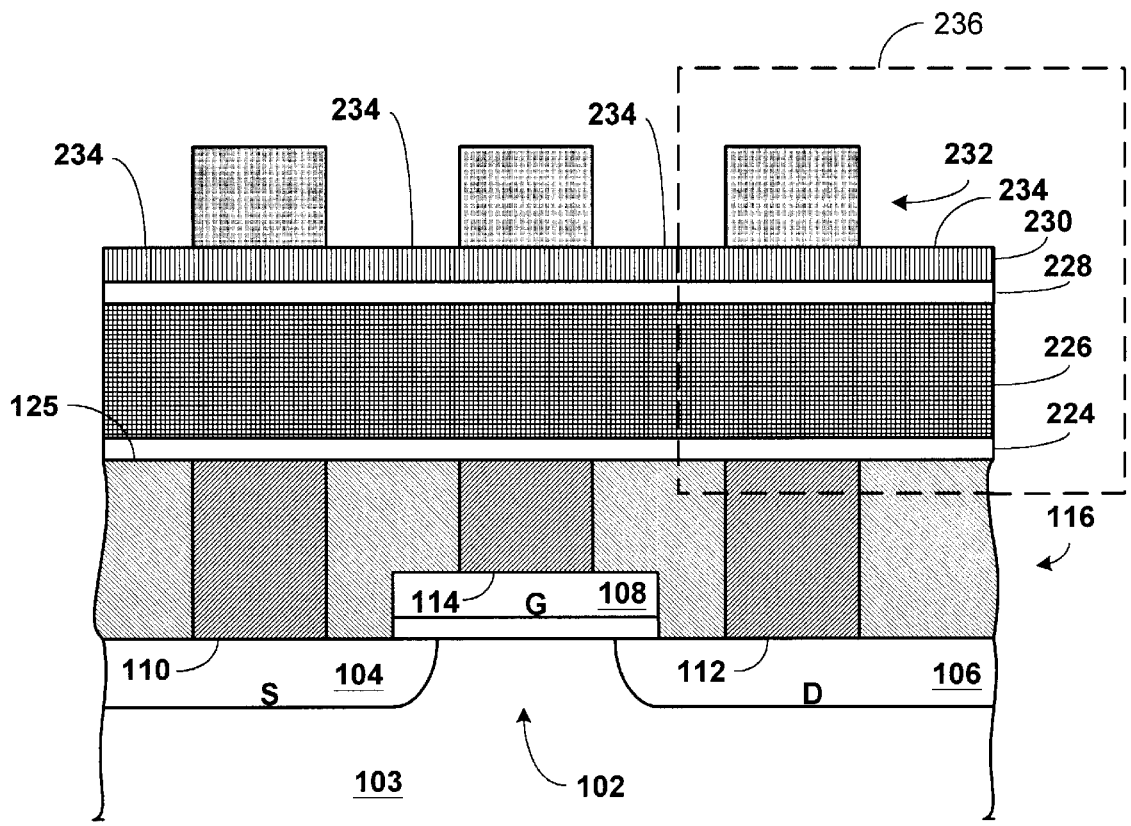
FIG. 2 illustrates a portion of a manufacturing process to form the structure as shown in FIG. 1.

FIG. 2 illustrates a portion of manufacturing process to form the structure as shown in FIG. 1. The elements 102–116 in FIG. 2 are the same as described above in FIG. 1. Referring to FIG. 2, in order to form the metal structures 118, 120 and 122 a barrier layer 224 is formed on the planarized surface 125. The barrier layer 224 is typically a layer of TiTiN. A layer 226 of metal, typically aluminum, is formed on the barrier layer 224. An antireflection coating (ARC) 228 is formed on the layer 226 of metal. The antireflection coating is typically a graded layer of TiN and Ti or a combination of TiN and Ti. A layer 230 of hard mask material is formed on the layer 228 of antireflection coating. The layer 230 of hard mask material is typically formed from silicon nitride or silicon oxynitride. A layer 232 of photoresist is formed on the layer 230 of hard mask material, patterned and developed to expose regions 234 of the layer 230 of hard mask material that are to be etched. The portion within the dashed line 236 is shown and discussed in more detail below.

Figure 3:
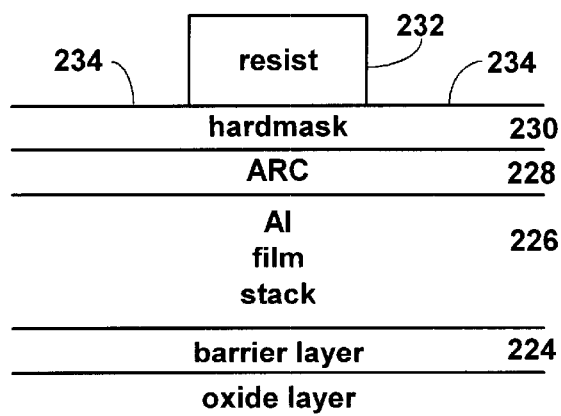
FIG. 3 illustrates a starting point for the metal stack-etch process.

FIG. 3 shows the portion within the dashed line 236 shown in FIG. 2. The portion 236 is the starting point for the discussion concerning the first alternative method discussed in FIGS. 4A & 4B and for the second alternative method discussed in FIGS. 5A–5C.

Figure 4A:
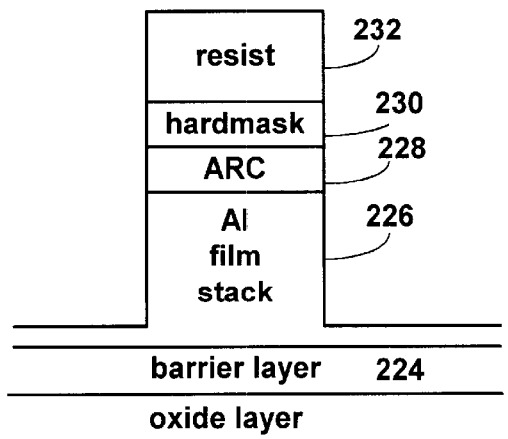
FIGS. 4A & 4B illustrate a first alternate method of a metal stack-etch process and the resulting metal stack structure.
Figure 4B:
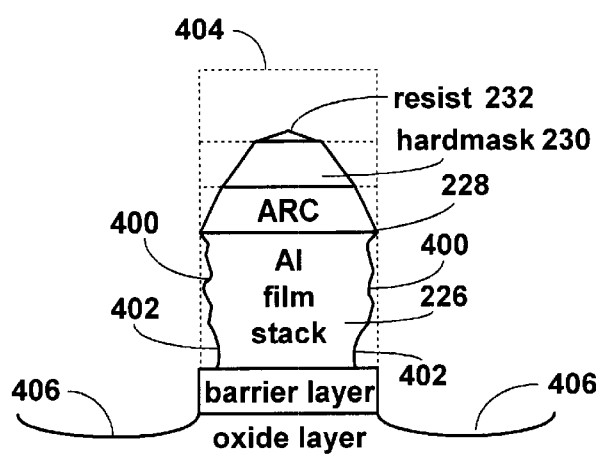

The first alternate method illustrated in FIGS. 4A & 4B includes a Breakthrough Step, a Main Etch Step and an Overetch Step. The hardmask layer 230 can be etched in an oxide etcher or be etched during the metal etch using the metal etch recipe. The Breakthrough Step removes the Antireflective layer 228, which is typically Ti, TiN or some combination of Ti and TiN. The Main Etch Step typically removes about 80% of the metal film layer as shown in FIG. 4A.

FIG. 4B shows the metal stack after the Overetch Step that etches the remaining portion of the layer 226 of metal, any stringers (small slivers of aluminum or other metal that could cause the device to short), the Barrier layer 224 and gouges portions of the Oxide layer (desirable to ensure that there are no portions of the barrier layer 224 (typically the barrier layer 224 material is conductive and could cause the device to short) remaining that could short the device. During the etch process that etches the metal films, the layer of photoresist is consumed. As discussed above, the requirement for smaller dimensions (higher density) has required the photolithography process to decrease the thickness of the layer 232 of photoresist due to focus and exposure limitations. The decreased thickness of the layer 232 of photoresist causes a balancing problem between achieving all the metal etch criteria and consuming the entire layer 232 of photoresist. Consumption of a substantial portion or consumption of the entire layer 232 of photoresist prior to the completion of the etch process can result in a non-smooth profile, indicated at 400 and profile undercutting, indicated at 402. The profile undercutting as shown at 402 can cause higher resistance in the metal line with resulting hotspots, other electrical parameter variations and loss of critical dimensions. The dashed line 404 shows the original dimension of the metal stack before the etch processes. These problems typically result in a decrease in yield and reliability problems in the final product. In order to achieve good photolithography results requires the layer 232 of photoresist to be 5500 Angstroms or less plus a requirement to achieve gouging of the oxide to a depth of about 600 + Angstroms can cause the layer 232 of photoresist to be completely consumed.

Figure 5A:
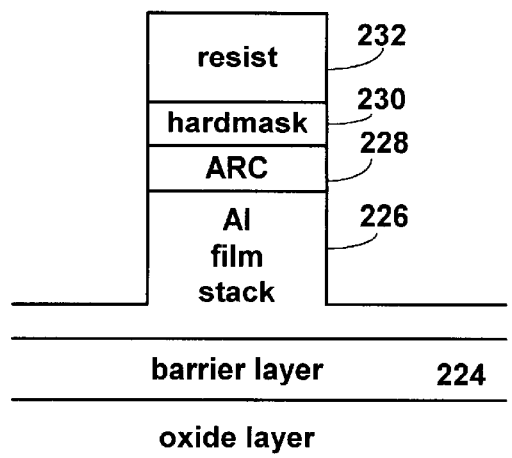
FIGS. 5A–5C illustrate a second alternate method of a metal stack-etch process and the resulting metal stack structure.
Figure 5B:
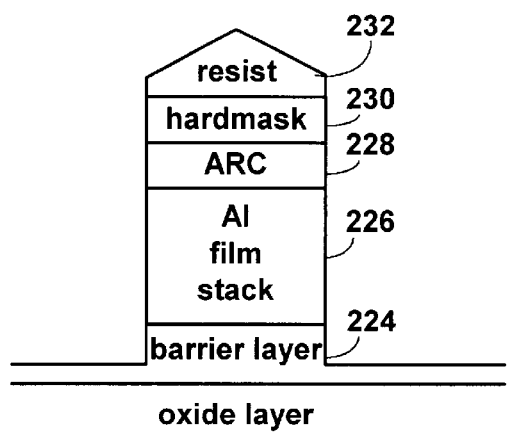
Figure 5C:
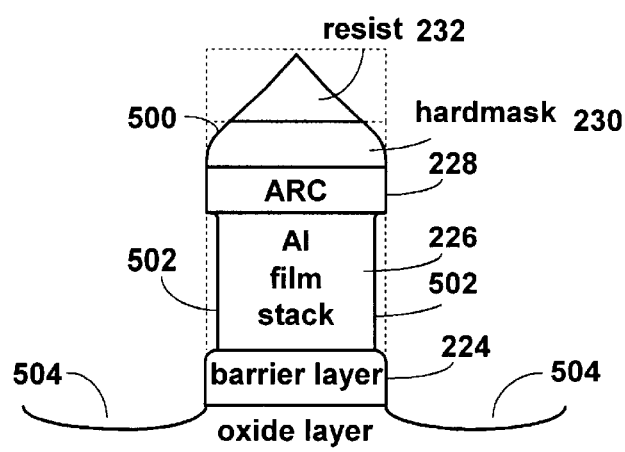

FIGS. 5A–5C illustrate a second alternate method of a metal stack-etch process and the resulting metal stack structure. The method illustrated in FIGS. 5A–5C uses the conventional Breakthrough Step and the conventional Main Etch Step. A standard overetch step for a reduced time is used and a second overetch step is added. The second overetch step utilizes a chemistry recipe comprising $BCl_3$ and Argon for a selected period of time depending upon the desired amount of oxide gouging. The reduced period of time for the standard overetch step and the selected period of time for the second overetch step are determined by a pre-characterization process that determines the times either by a computer modeling process or by an empirical method.

FIG. 5A shows the metal stack as shown in FIG. 3 after a breakthrough etch step that removes the antireflective layer 228 and a conventional main etch step that removes about 80% of the stack as shown in FIG. 5A. The hardmask material is etched with a $BCl_3/Ar/CHF_3$ gas chemistry. The breakthrough step uses $BCl_3/Cl_2/Ar/CHF_3$ to etch the antireflective layer 228. The conventional main etch step uses the following chemistry recipe:

| | | | |
|---|---|---|---|
| $BCl_3$ | about 17 sccm | Ar | about 50 sccm |
| $Cl_2$ | about 43 sccm | $CHF_3$ | about 3 sccm |
| Pressure | about 14 mtorr | | |
| Source Power | about 1000 watts | | |
| Bias Power | about 150 watts | | |

FIG. 5B shows the metal stack as shown in FIG. 5A after a standard overetch step for a reduced time that further etches the metal stack.

The standard overetch step uses the following chemistry recipe:

| | | | |
|---|---|---|---|
| BCl$_3$ | about 41 sccm | Ar | about 50 sccm |
| Cl$_2$ | about 34 sccm | CHF$_3$ | about 3 sccm |
| Pressure | about 12 mtorr | | |
| Source power | about 1000 watts | | |
| Bias power | about 130 watts | | |
| Time | determined by a pre-characterization procedure. | | |

FIG. 5C shows the metal stack as shown in FIG. 5B after a second overetch step. The second overetch step uses the following chemistry recipe:

| | | | |
|---|---|---|---|
| BCl$_3$ | 10–35 sccm | N$_2$ | 0–8 sccm |
| Ar | 0–50 sccm | CHF$_3$ | 0–8 sccm |
| Pressure | 10–18 mtorr | | |
| Source Power | 600–1400 W | | |
| Bias Power | 100–150 W | | |
| Time | determined by a pre-characterization procedure. | | |

The combined etch chemistries result in a sufficient amount of the layer 232 remaining, a minimal amount of the hardmask layer 230 consumed, as indicated at 500, smooth sidewalls on the layer 226 of aluminum indicated at 502 and a sufficient amount of oxide gouged indicated at 504.

In summary, the present invention overcomes the limitations of the prior art and fulfills the need for metal stacks having straight profiles and smooth surfaces for semiconductor devices.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of manufacturing a semiconductor device, the method comprising:
   (a) forming a layer of oxide containing first metal structures electrically communicating with electrodes of active devices formed in an underlying substrate;
   (b) forming a barrier layer on the layer of oxide;
   (c) forming a layer of metal on the barrier layer;
   (d) forming an antireflection layer on the layer of metal;
   (e) forming a hard mask layer on the antireflection layer;
   (f) forming a layer of photoresist on the hard mask layer;
   (g) patterning and developing the layer of photoresist to leave second metal structures communicating with first metal structures;
   (h) an etch process to etch through the layer of a hard mask layer;
   (i) an etch process to etch through the antireflection layer;
   (j) an etch process to etch about 80% of the layer of metal;
   (k) a first overetch step for a first selected time; and
   (l) a second overetch step for a second selected time.

2. The method of claim 1 wherein the first overetch step comprises the following chemistry:
   BCl$_3$ at about 41 sccm;
   Ar at about 50 sccm;
   Cl$_2$ at about 34 sccm;
   CHF$_3$ at about 3 sccm;
   a pressure of about 12 mtorr;
   source power of about 1000 watts;
   bias power of about 130 watts; and
   applied for a the first selected time, wherein the first selected time is determined during a pre-characterization procedure.

3. The method of claim 2 wherein the second overetch step comprises the following chemistry:
   BCl$_3$ between 10–35 sccm;
   Ar between 0–50 sccm;
   N$_2$ between 0–8 sccm;
   CHF$_3$ between 0–8 sccm;
   a pressure between 10–18 mtorr;
   source power between 600–1400 watts;
   bias power between 100–2000 watts; and
   applied for the second selected time, wherein the second selected time is determined during the pre-characterization procedure.

4. The method of claim 3, wherein the etch process to etch about 80% of the layer of metal film comprises the following chemistry:
   BCl$_3$ at about 17 sccm;
   Ar at about 50 sccm;
   Cl$_2$ at about 43 sccm;
   CHF$_3$ at about 3 sccm;
   a pressure of about 14 mtorr;
   source power of about 1000 watts; and
   bias power of about 150 watts.

5. The method of claim 4, wherein the etch process to etch through the antireflection layer comprises the chemistry BCl$_3$, Cl$_2$, Ar, and CHF$_3$.

6. The method of claim 5, wherein the etch process to etch through the hardmask layer comprises the chemistry BCl$_3$, Ar, and CHF$_3$.

* * * * *